United States Patent [19]

Arvanitis

[11] 4,342,014
[45] Jul. 27, 1982

[54] MULTI-RESONATOR CRYSTAL FILTER HAVING A REDUCED NUMBER OF PINS AND METHOD OF FABRICATION THEREOF

[75] Inventor: Aristotelis Arvanitis, Addison, Ill.

[73] Assignee: Motorola, Inc., Schaumburg, Ill.

[21] Appl. No.: 222,430

[22] Filed: Jan. 5, 1981

[51] Int. Cl.³ .................... H03H 3/04; H03H 9/56; H03H 9/15
[52] U.S. Cl. .................... 333/191; 29/25.35; 324/56; 333/192
[58] Field of Search .................... 333/186–192; 29/25.35, 593; 427/8, 9, 100; 331/107 A, 116 R, 139, 154, 163, 73, 77; 324/56, 80, 81; 310/311, 317–321, 365–366

[56] References Cited

U.S. PATENT DOCUMENTS

| | | | |
|---|---|---|---|
| 3,756,851 | 9/1973 | Rennick et al. | 333/191 X |
| 3,992,760 | 11/1976 | Roberts | 29/25.35 |
| 4,112,147 | 9/1978 | Thompson | 427/100 X |
| 4,281,300 | 7/1981 | Arvanitis | 333/191 X |

Primary Examiner—Marvin L. Nussbaum
Attorney, Agent, or Firm—Mark P. Kahler; Edward M. Roney; James W. Gillman

[57] ABSTRACT

A multi-resonator crystal filter is provided having a reduced number of electrical connecting pins. The monolithic crystal filter includes at least four resonators, namely, an input resonator, an output resonator and electrically coupled center resonators. A single electrical pin connection is made to the electrically coupled together center resonators thus avoiding the need for an individual connecting pin for each resonator.

5 Claims, 15 Drawing Figures

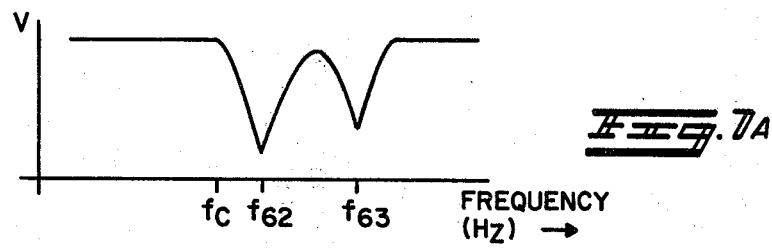
_FIG. 7A_
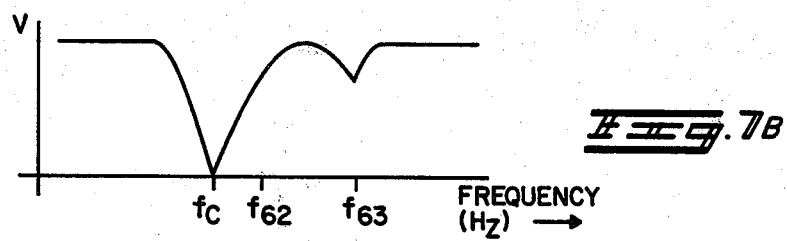
_FIG. 7B_
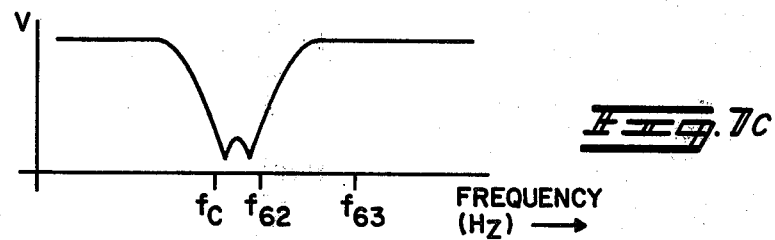
_FIG. 7C_
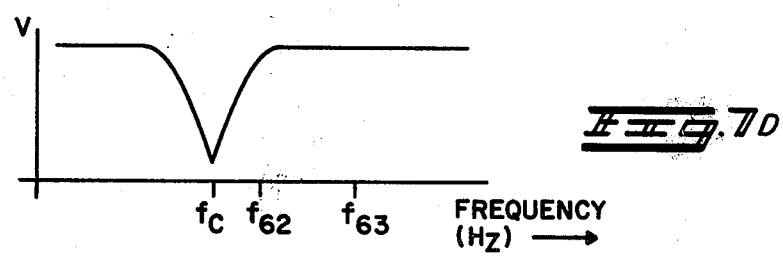
_FIG. 7D_
_FIG. 8_
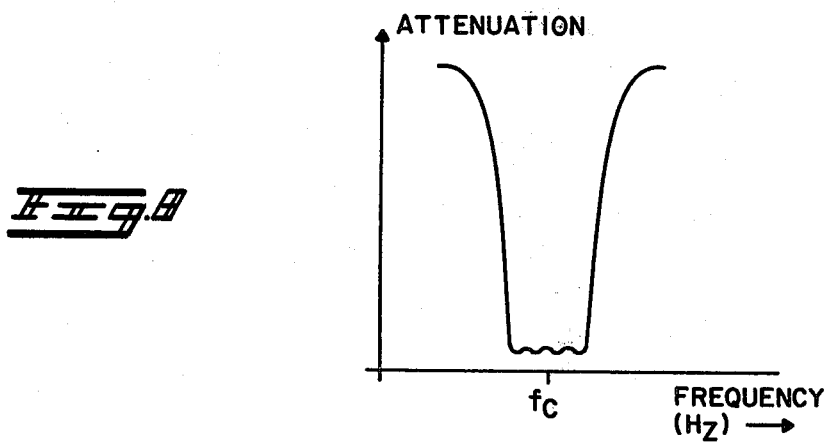

MULTI-RESONATOR CRYSTAL FILTER HAVING A REDUCED NUMBER OF PINS AND METHOD OF FABRICATION THEREOF

BACKGROUND OF THE INVENTION

This invention relates generally to crystal filters, and more particularly to the tuning and adjustment to resonant frequency of the resonators of a multi-resonator acoustically coupled crystal filter in such a manner as to require a maximum of four electrical mounting pins.

DESCRIPTION OF THE PRIOR ART

FIG. 1 shows a conventional multi-resonator monolithic crystal filter 10. Filter 10 includes a piezoelectric crystal blank 12 comprised of quartz and having resonators 14 and 16 disposed thereon. More specifically, resonators 14 and 16 each include electrodes 14A and 16A disposed on one surface of crystal blank 12. Resonators 14 and 16 further include electrodes 14B and 16B, respectively, disposed on a surface of crystal 12 opposite electrodes 14A and 16A as shown. It is seen that electrodes 14A, 14B, 16A and 16B provide four points at which electrical connection to crystal 12 may be made. Four electrical mounting pins are thus customarily required in the crystal base employed to mount crystal filter 10.

FIG. 2 shows apparatus which is typically employed to adjust a monolithic crystal filter such as filter 10 to a desired center frequency $f_c$. To form resonators 14 and 16, a sufficient amount of metallic resonator material is deposited on crystal 12 such that resonators 14 and 16 resonate at approximately the desired center frequency $f_c$. After such deposition, which is henceforth referred to as "adjustment" or "adjustment to $f_c$", resonators 14 and 16 resonate respectively at frequencies $f_1$ and $f_2$ as shown by the dips in the voltage versus frequency response curves of resonators 14 and 16 respectively depicted in FIG. 3A and FIG. 3B. Such a voltage frequency response curve as in FIG. 3A is typically observed when a single generator 20 and a voltage monitor 21 are coupled to resonator 14 in the manner of FIG. 2. A switch 22 is appropriately positioned to accomplish such coupling. The voltage frequency response curve of FIG. 3B is typically observed when generator 20 and monitor 21 are coupled to resonator 16 via switch 22. It is noted that less than the total amount of metallic material required to cause resonators 14 and 16 to resonate at the desired center frequency $f_c$ is deposited on crystal 12 at resonators 14 and 16. The resonant frequencies $f_1$ and $f_2$ of resonators 14 and 16, respectively, are thus higher in frequency than the final desired center frequency $f_c$ of filter 10. Therefore, the voltage frequency response of resonators 14 and 16 of filter 10 may be adjusted by depositing additional resonator material on such resonators until each of such resonators resonates at $f_c$. More specifically, conductive material is first applied to resonator 14 to change the resonant frequency thereof from $f_1$ to $f_c$ resulting in the voltage frequency response curve of FIG. 3C. After such deposition, additional material is deposited on resonator 16 until the $f_2$ resonant frequency of resonator 16 is changed from $f_2$ to $f_c$ resulting in the voltage frequency response curve shown in FIG. 3C.

To achieve these resonator adjustments, however, it is necessary to adjust each resonator separately. Each resonator must be isolated from the other. To accomplish this isolation when adjusting resonators 14 and 16 respectively from the $f_1$ and $f_2$ resonant frequencies to the desired center frequency $f_c$, adjustable impedance elements 24 and 26 are respectively coupled between electrodes 14A and 14B of resonator 14 and between electrodes 16A and 16B of resonator 16. Resonators 14 and 16 each exhibit an interelectrode capacitance $C_o$ between the electrodes thereof. To isolate resonator 16 from resonator 14 before resonator 14 is adjusted to frequency $f_c$, the impedance of impedance element 24 is varied to tune out the $C_o$ interelectrode capacitance associated with resonator 14 such that essentially no current flows through the loop formed by resonator 14 and impedance element 24 when crystal filter 10 is excited by signal generator 20. In a like manner resonator 14 is isolated from resonator 16 by varying the impedance of impedance element 26 so as to tune out the interelectrode capacitance $C_o$ associated with resonator 16. Thus, effectively no current flows through the loop formed by resonator 16 and impedance element 26. For convenience, impedance elements 24 and 26 are shown as adjustable parallel tuned LC (inductor-capacitor) circuits. While resonators 14 and 16 are so isolated from each other, generator 20 and monitor 21 are coupled to resonator 14 via switch 22 as shown in FIG. 2. Sufficient additional conductive material is deposited on resonator 14 until the resonant frequency of resonator 14 (as determined by monitor 21) substantially equals the desired center frequency $f_c$ resulting in the voltage frequency response curve of FIG. 3C. To adjust the resonant frequency of resonator 16 from $f_2$ to $f_c$, generator 20 and monitor 21 are coupled to resonator 16 via switch 22. A sufficient quantity of conductive material is deposited on resonator 16 to change the resonant frequency of resonator 16 to the desired center frequency $f_c$. After such adjustment the resonators 14 and 16 of crystal 10 each exhibit the voltage frequency response shown in FIG. 3C.

The term "tuning" is used henceforth to signify the above described step of tuning out the interelectrode capacitance $C_o$ of resonators situated on a crystal blank.

It is seen that access to each of the resonators of crystal 10 is required in order to achieve adjustment of the crystal resonators to the desired frequency $f_c$. That is, a crystal base or package employed to mount filter 10 must include an electrical connection point or pin for each resonator when the crystal is adjusted after mounting in the base or package. Such adjustment of the crystal resonators after mounting crystal 10 in a base is desirable in order to minimize crystal handling and potential breakage of crystal 10 during adjustment. Providing a crystal base with a separate mounting or electrical connection pin for each resonator of a filter does not present a problem for a monolithic crystal filter having a low number of resonators, for example two as in the example just discussed. However, mounting pin spacing problems may be encountered if in-package resonator adjustment is to be provided for monolithic crystal filters having a large number of resonators such as four as shown in crystal filter 28 of FIG. 4. In such case, a separate electrical mounting pin must be provided for each of the four resonators plus an additional mounting pin for a ground or reference connection. Thus, a total of five pins must be provided for a conventional four resonator monolithic crystal filter. Such a number of leads or pins becomes impractical for the small crystal holders such as the HC-18 typically used in the crystal industry. Such holder usually accommodates no more than four pins. Attempts to increase the number of pins beyond four result in severe pin crowding and concomitant hermeticity problems. Further, pin crowding causes inter-pin capacitance to become significant and hinder adjustment of the resonators of a crystal to the desired resonant frequency $f_c$. Thus, the conventional four or more resonator monolithic crystal filter and the method of adjustment of resonators described above is impractical when employed in small crystal holders.

When the four resonator crystal filter 28 of FIG. 4 is mounted in a relatively large conventional crystal holder having an electrically connective mounting pin for each resonator thereof and ground, such filter 28 is adjusted to resonant frequency $f_c$ in a manner similar to the adjustment of the two resonator crystal filter 10 of FIG. 1. Filter 28 includes a crystal blank 30 having resonators 31, 32, 33 and 34 disposed thereon. Each of such resonators is connected to a respective adjustable impedance network 41, 42, 43 and 44 as shown in FIG. 4. To isolate resonators 31, 32, 33 and 34 from each other prior to adjustment to the resonant frequency of such resonators, the interelectrode capacitances $C_o$ of each of such resonators are tuned out by appropriately varying the impedances of impedance networks 41, 42, 43 and 44 as already described above. To adjust resonators 31 through 34 to the desired resonant frequency $f_c$ each resonator is successively coupled to signal generator 20 and voltage monitor 21 by appropriately setting a multi-terminal switch 23 therebetween as shown in FIG. 4. When so coupled to signal generator 20 and monitor 21, each of resonators 31 through 34 receives a deposition of metallic material in sufficient quantity to cause the resonators to resonate at the selected frequency $f_c$. This tuning and adjustment method, however, undesirably requires that a separate electrical pin connection be provided for each resonator when in-package adjustment of the resonators to resonant frequency is conducted.

It is one object of the present invention to provide a multi-resonator monolithic crystal filter having a reduced number of electrical connection mounting pins.

Another object of the present invention is to provide a method for adjustment to resonant frequency of a multi-resonator monolithic crystal filter having a reduced number of electrical connection mounting pins.

These and other objects of the invention will become apparent to those skilled in the art upon consideration of the following description of the invention.

BRIEF SUMMARY OF THE INVENTION

The present invention is directed to providing a multi-resonator monolithic crystal filter having a reduced number of electrical connecting pins and to a method for fabricating and adjusting such filter to resonate at a desired resonant frequency. In accordance with one embodiment of the invention, a multi-resonator cyrstal filter includes a piezoelectric crystal blank having first and second opposed surfaces. At least four resonators are disposed on the crystal blank. Each resonator includes a first electrode situated on the first surface and a second electrode situated on the second surface opposite the first electrode. Two of the at least four resonators are designated input and output resonators. A first connecting element is situated on the first surface for electrically coupling together the electrodes on the first surface other than the electrodes of the input and output resonators. A second connecting element is situated on the second surface for electrically coupling together the second electrodes. The first and second connecting elements are situated sufficiently far apart on the opposed crystal surfaces so as to prevent formation of another resonator by the first and second connecting elements.

The features of the invention believed to be novel are set forth with particularity in the appended claims. The invention itself, however, both as to organization and method of operation, together with further objects and advantages thereof, may best be understood by reference to the following description taken in conjunction with the accompanying drawings.

BRIEF DESCRIPTION OF THE DRAWINGS

FIG. 7A is a voltage frequency response graph of connected resonators 62 and 63 of the monolithic crystal filter of FIG. 5 prior to adjustment of such resonators to a selected resonant frequency.

FIG. 7B is a voltage frequency response graph of connected resonators 62 and 63 of the monolithic crystal filter of FIG. 5 after resonator 62 has been adjusted to resonate at a selected frequency $f_c$.

FIG. 7C is a voltage frequency response graph of the connected resonators 62 and 63 of the FIG. 5 filter after deposition of an amount of resonator material sufficient to cause such resonators to resonate at frequencies approaching the desired resonant frequencies $f_c$.

FIG. 7D is a voltage frequency response graph of connected resonators 62 and 63 of the FIG. 5 filter after such resonators have been adjusted to resonate at the selected resonant frequency.

FIG. 8 is an attenuation response curve of the filter of FIG. 5 after all the resonators thereof have been adjusted to resonate at the selected resonant frequency.

DESCRIPTION OF THE PREFERRED EMBODIMENTS

Figure 1:
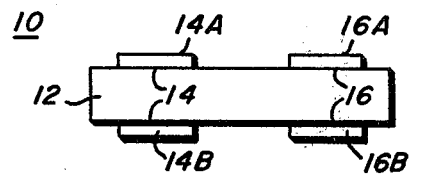
FIG. 1 shows a conventional two resonator monolithic crystal filter.
Figure 2:
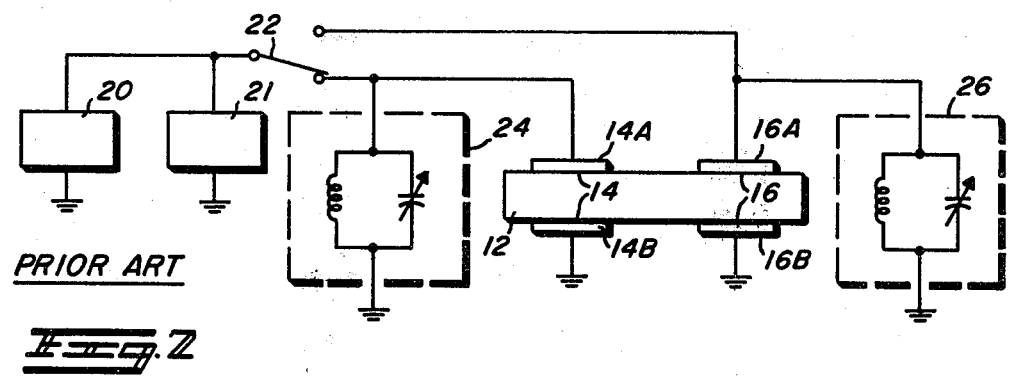
FIG. 2 shows apparatus for adjusting the resonators of the filter of FIG. 1 to a desired resonant frequency.
Figure 3A:
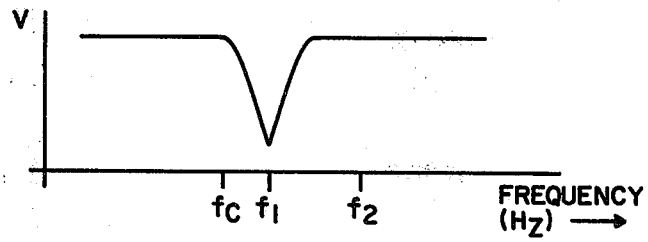
FIG. 3A is a graph showing the voltage frequency response of one resonator of the filter of FIG. 1.
Figure 3B:
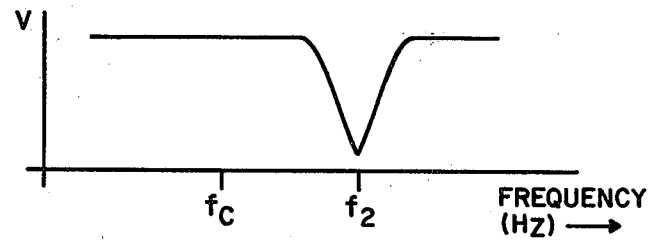
FIG. 3B is a graph showing the voltage frequency response of the remaining resonator of the filter of FIG. 1.
Figure 3C:
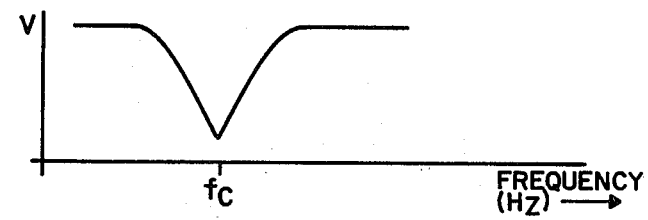
FIG. 3C is a graph of the voltage frequency response of each of the resonators of the filter of FIG. 1 after such resonators have been adjusted to the desired resonant frequency.
Figure 4:
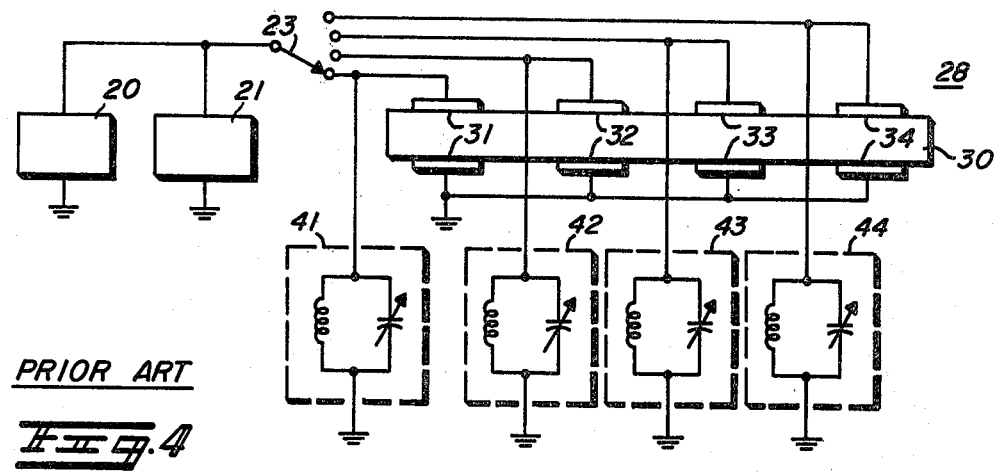
FIG. 4 shows a conventional four resonator monolithic crystal filter and apparatus for adjusting the resonators thereof to a desired resonant frequency.
Figure 5:
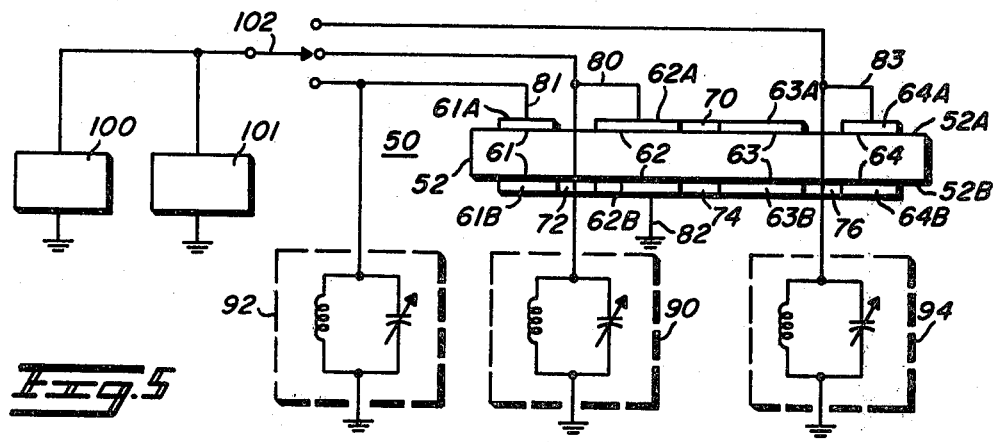
FIG. 5 shows one embodiment of the monolithic crystal filter of the present invention including apparatus for adjusting the resonators thereof to a selected resonant frequency.

A four resonator monolithic crystal filter 50 in accordance with the present invention is shown in FIG. 5. It is noted that the present invention encompasses monolithic crystal filters having virtually any number of resonators equal to or greater than 4. Monolithic crystal filter 50 includes a piezoelectric crystal 52 having opposed surfaces 52A and 52B. Four resonators 61, 62, 63 and 64 are situated on crystal surfaces 52A and 52B as shown. Vapor deposition is typically employed to deposit resonators 61 through 64 on crystal 52. More specifically, resonators 61 through 64 respectively include first electrodes 61A, 62A, 63A and 64A situated on top crystal surface 52A. Resonators 61 through 64 respectively include second electrodes 61B, 62B, 63B and 64B situated on bottom crystal surface 52B opposite the respective first electrodes 61A through 64A. Resonator 61 is designated the input resonator. Resonator 64 is designated the output resonator.

Figure 6A:
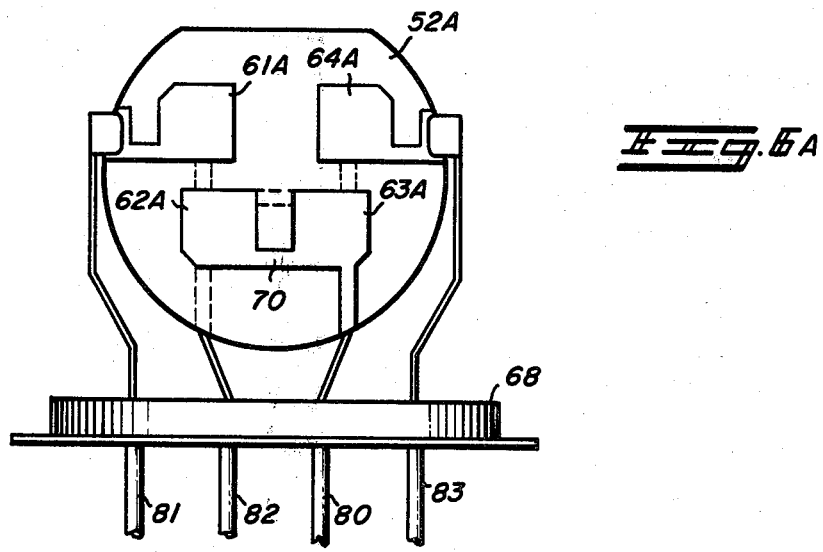
FIG. 6A is a top view of the filter of FIG. 5 shown mounted in a crystal base.
Figure 6B:
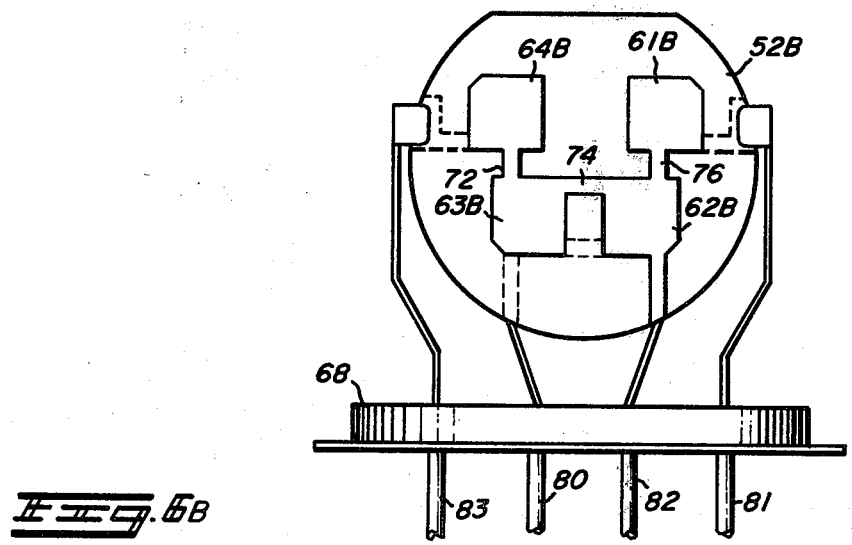
FIG. 6B is a bottom view of the monolithic crystal filter of FIG. 5 shown mounted in a crystal base.

As shown in FIG. 5 and more clearly in FIG. 6A, a connecting element 70 is situated on crystal surface 52A between electrodes 62A and 63A to electrically connect such electrodes together. Connecting element 70 typically comprises a thin strip of electrically conductive material. Connecting element 70 is large enough to achieve a substantial electrical connection between electrodes 62A and 63A. All resonators of monolithic crystal filters in accordance with the present invention other than those resonators designated input and output resonators (here respectively resonators 61 and 64) are designated center resonators or connected resonators. Since the center resonators, here resonators 62 and 63, are electrically coupled together via connecting element 70, a separate electrical pin connection need not be provided in mounting base 68 (see FIGS. 6A and 6B) for each of the resonators 62 and 63. Rather a single electrical pin connection 80, shown schematically in FIG. 5 and structurally in FIGS. 6A and 6B, is employed. To tune out the combined interelectrode capacitance $C_0$ of center resonators 62 and 63 only one impedance network 90 is coupled to connecting pin 80 to achieve such tuning. Since connecting pin 80 is coupled to both of connected resonators 62 and 63, a separate electrical connection need not be made to each of resonators 62 and 63 when such resonators are adjusted to resonant frequency as per the subsequent discussion. The number of electrical connecting pins required to tune and adjust the monolithic crystal filter of the invention is thus reduced.

Electrodes 61B, 62B, 63B and 64B are electrically connected together via connecting elements 72, 74 and 76 as shown by structural representation in FIG. 5 and more clearly in FIG. 6B. Connecting elements 72, 74 and 76 are sufficiently large to achieve electrical connection among electrodes 61B, 62B, 63B and 64B which are designated reference electrodes. The connecting element disposed on crystal surface 52A (here, element 70) and the connecting elements disposed on crystal surface 52B (here, elements 72, 74, 76) are situated sufficiently far apart to prevent formation of another resonator by such connecting elements.

Electrical connecting pins 81 and 83 are connected to input electrode 61A and output electrodes 64A, respectively, as seen in FIGS. 5 and 6A. An electrical connecting pin 82 is connected to electrode 62B as shown or to any other reference electrode. Thus, pin 82 is coupled to electrodes 61B, 62B, 63B and 64B. Pin 82 is typically connected to a reference potential or ground.

In accordance with the method of the present invention for fabricating and adjusting the resonators of the above-described monolithic crystal filter 50 to a selected resonant frequency, $f_c$, a signal generator 100 capable of producing signals near the selected filter center frequency $f_c$ is coupled to input resonator 61 via electrode 61A by appropriately positioning the wiper of a multiposition switch 102 which selectively connects generator 100 and a voltage monitor 101 to electrodes 61A, 64A and to connected electrodes 62A and 63A. Resonators 61 and 64 each exhibit an interelectrode capacitance $C_0$ between the respective electrodes thereof. Connected center resonators 62 and 63 exhibit a combined interelectrode capacitance $C_0$ between the electrodes thereof. Prior to adjusting each of resonators 61, 64 and center resonators 62-63 to resonate at the center frequency $f_c$, a respective impedance network is coupled to each of resonators 61 and 64 and to center resonators 62-63. More specifically, an adjustable impedance network 92, typically comprising a parallel tuned LC circuit, is coupled to electrode 61A as shown in FIG. 5. As already discussed, an adjustable impedance network 90 is coupled to electrode 62A and is thus coupled to both resonators 62 and 63. An adjustable impedance network 94 is coupled to electrode 64A to connect network 94 to output resonator 64.

The impedance of impedance network 90 is varied until it exhibits an impedance sufficient to tune out the combined interelectrode capacitance $C_0$ of center resonators 62-63 such that essentially no current flows through the loop formed by center resonators 62-63 and impedance network 90 when excited by signal generator 100. In a similar manner, the impedance of impedance network 92 is varied until network 92 exhibits a sufficient impedance to tune out the interelectrode capacitance $C_0$ of resonator 61 such that essentially no current flows through the loop formed by resonator 61 and network 92 when excited by generator 100. The interelectrode capacitance $C_0$ of resonator 64 is tuned out by varying the impedance of impedance network 94 in the same manner as just described for resonator 61.

Resonators 61, 62, 63 and 64 each typically exhibit a different resonant frequency. The amount of electrode material of each resonator is controlled and limited such that the resonant frequencies of each of resonators 61 through 64 are slightly higher than the desired filter center frequency $f_c$. By adding additional electrode material to resonators 61 through 64 in a controlled manner, each of resonators 61 through 64 is caused to resonate at the center frequency $f_c$. Since the interelectrode capacitances $C_0$ of input resonator 61, output resonator 64 and center resonators 62-63 have been tuned out in the manner described above, resonators 61, 64 and center resonators 62-63 are effectively isolated from each other.

As mentioned, center resonators 62 and 63 exhibit resonant frequencies $f_{62}$ and $f_{63}$ slightly above the desired filter center frequency $f_c$ as shown in the filter voltage frequency response graph of FIG. 7A. (For simplicity, the resonant frequencies $f_{61}$ and $f_{62}$ respectively exhibited by resonators 61 and 64 have not been shown in FIG. 7A.) To adjust resonator 62 from resonant frequency $f_{62}$ to center frequency $f_c$, a sufficient amount of electrically conductive material is deposited on the electrodes of resonator 62 to cause resonator 62 to resonate at the center frequency $f_c$. This results in the voltage frequency response for resonator 62 shown in FIG. 7B. (Again, the resonant frequencies $f_{61}$ and $f_{64}$ of input resonator 61 and output resonator 64, respectively, are not shown in FIG. 7B.) A sufficient amount of electrically conductive material is then deposited on resonator 63 to cause resonator 63 to change resonant frequency from $f_{63}$ to the desired filter center frequency $f_c$ resulting in a frequency response curve for filter 50 such as that shown in FIG. 7D. Thus, after such adjustment, resonators 62 and 63 both resonate at $f_c$.

Alternatively, the respective resonant frequencies $f_{62}$ and $f_{63}$ of resonators 62 and 63 may simultaneously be "walked down" to $f_c$ by adding small quantities of electrically conductive material to resonators 62 and 63 at the same time and observing the voltage frequency response of center resonators 62 and 63 on monitor 101. As the resonant frequencies of resonators 62 and 63 approach $f_c$, a voltage frequency response curve such as that shown in FIG. 7C is typically generated. Deposition of electrically conductive material on resonators 62 and 63 is continued until both resonators resonate at $f_c$ as shown in FIG. 7D. It is again noted that the structure and method of the present invention advantageously allow tuning and adjustment of the center resonators 62 and 63 by connection of but one connecting pin 80 thereto.

Input resonator 61 and output resonator 64 remain to be adjusted to resonate at center frequency $f_c$. To adjust resonator 61 to resonate at frequency $f_c$, the interelectrode capacitances of resonator 64 and center resonators 62–63 are allowed to remain in the tuned-out state already achieved. With resonator 64 and center resonators 62–63 thus isolated from resonator 61, an amount of electrically conductive material sufficient to change the resonant frequency of resonator 61 from $f_{61}$ to center frequency $f_c$ is deposited on the electrodes of resonator 61.

To tune resonator 64 from resonant frequency $f_{64}$ to the desired filter center frequency $f_c$, the interelectrode capacitances of resonator 61 and center resonators 62–63 are again allowed to remain in the tuned-out state achieved above. Resonator 64 is thus essentially isolated from resonator 61 and center resonators 62–63. Under these conditions, a sufficient amount of electrically conductive material is deposited on resonator 64 to change the resonant frequency thereof from $f_{64}$ to the desired filter center frequency $f_c$. All four resonators 61, 62, 63 and 64 are thus made resonant at center frequency $f_c$ and each resonator exhibits the voltage frequency response depicted in the graph shown in FIG. 7D. After the tuning and adjustment described above has been conducted, filter 50 exhibits the attenuation response curve shown in FIG. 8

Figure 9:
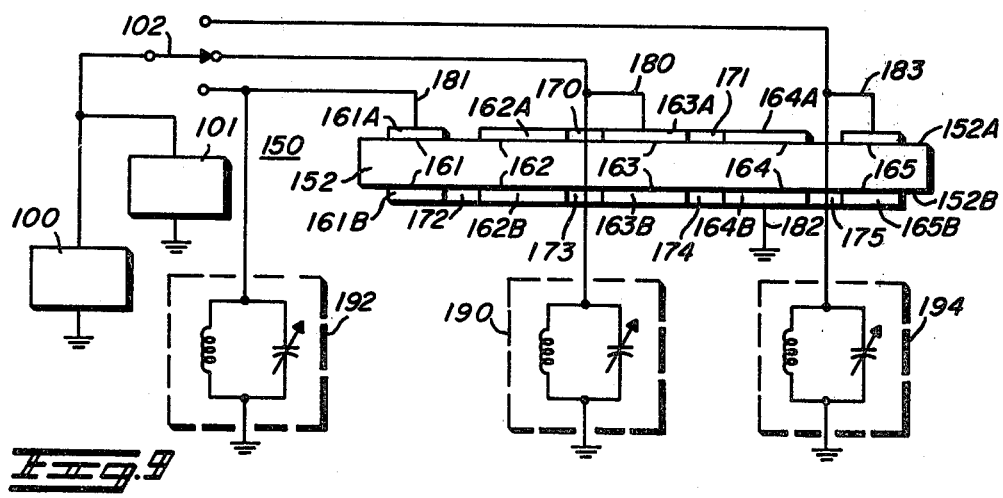
FIG. 9 is a five resonator monolithic crystal filter in accordance with the present invention.

Although a four resonator monolithic crystal filter with a reduced number of electrical connecting pins and a method of fabrication thereof has been described above, it is noted that the present invention applies to monolithic crystal filters having virtually any number of resonators equal to four or more. In FIG. 9 a five resonator monolithic crystal filter 150 in accordance with the present invention is shown. Crystal filter 150 includes a piezoelectric crystal 152 having opposed surfaces 152A and 152B. Resonators 161, 162, 163, 164 and 165 are situated on surfaces 152A and 152B. More specifically, resonators 161 through 165 respectively include first electrodes 161A through 165A situated on top surface 152A as shown in FIG. 9. Resonators 161 through 165 further respectively include electrodes 161B through 165B situated on bottom crystal surface 152B opposite the corresponding resonators 161A through 165A. Resonators 162, 163 and 164 are designated center resonators. Electrodes 162A, 163A and 164A are electrically coupled together by connecting elements 170 and 171 in a manner similar to that in which connecting element 70 connects electrodes 62A and 63A together in the already discussed crystal filter 50 of FIG. 5. Referring again to FIG. 9, the five electrodes 161B through 165B are electrically coupled together by connecting elements 172, 173, 174 and 175 in a manner similar to that in which connecting elements 72, 74 and 76 couple together the electrodes on the bottom surface 52B of the already discussed crystal filter 50 of FIG. 5. Referring once again to FIG. 9, in a manner analogous to filter 50 already described, four connecting pins are provided to filter 150. That is, an electrical connecting pin 181 is coupled to electrode 161 to achieve electrical connection to input resonator 161. According to the present invention, advantageously only one electrical connecting pin 180 is electrically coupled to electrode 163A to achieve electrical connection to center resonators 162, 163 and 164. The savings thus made in terms of reducing the number of electrical pin connections required for the crystal filter of the present invention is readily appreciated by those skilled in the art especially as the number of resonators included in the crystal filter becomes large. An electrical connecting pin 183 is coupled to electrode 165A to achieve electrical coupling to output resonator 165. An electrical connecting pin 182 is coupled to electrode 164B to achieve electrical connection to common electrodes 161B through 165B. Pin 182 is connected to ground to couple electrodes 161B through 165B to a common electrical potential or reference.

It is seen that by employing the present invention, monolithic crystal filters may be produced having virtually any number of resonators but requiring a minimal amount of connecting pins, namely four. That is, electrical connecting pins are required for an input resonator, an output resonator, the center resonators (one pin for all) and the common electrodes (one pin for all).

To adjust input resonator 161, output resonator 165 and center resonators 162–164 of filter 150 to resonate at center frequency $f_c$, resonators 161, 165 and center resonators 162–164 are first isolated from each other in a manner similar to the tuning out of the interelectrode capacitances of the resonators of crystal filter 50 of FIG. 5. That is, the interelectrode capacitance of input resonator 161 is tuned out by varying the impedance of an impedance network 192 coupled thereto and the interelectrode capacitance of output resonator 165 is tuned out by varying the impedance of an impedance network 194 coupled thereto until no currents flow in the respective loops formed by resonator 161-network 192 and resonator 165-network 194. The combined interelectrode capacitance of center resonators 162, 163 and 164 is tuned out by varying the impedance of an impedance network 190 coupled to center resonators 162 through 164 until essentially no current flows through the loop formed by network 190 and center resonators 162 through 164. Input resonator 161, output resonator 165 and combined center resonators 162–164 are thus isolated from each other.

Each of the three center resonators 162 through 164 typically exhibits a different resonant frequency. To adjust center resonators 162 through 164 to resonate at $f_c$, sufficient electrically conductive material is deposited on the electrodes of each of resonators 162 through 164 to cause each of these center resonators to resonate at center frequency $f_c$ as indicated by monitor 101.

To adjust input resonator 161 to resonate at center frequency $f_c$, an amount of electrically conductive material sufficient to cause resonator 161 to resonate at center frequency $f_c$ is deposited on the electrodes of input resonator 161.

To adjust output resonator 165 to resonate at the desired center frequency $f_c$, an amount of electrically conductive material sufficient to cause resonator 165 to resonate at frequency $f_c$ is deposited on the electrodes of resonator 165. Thus, it is seen that after the above adjustment procedure is implemented, each of the five resonators 161 through 165 of monolithic crystal filter 150 resonates at the same filter center frequency $f_c$.

It is understood that alternatively, if more than the amount of electrically conductive material is deposited on a resonator than is required to cause such resonator to resonate at the desired filter center frequency $f_c$, then an amount of electrode material sufficient to cause the subject resonator to resonate at $f_c$ is removed from the resonator. Many techniques known to those skilled in the art such as laser evaporation, for example, may be employed to remove conductive electrode material from a resonator.

To briefly summarize, the above method for fabricating an adjusting a multi-resonator crystal filter having a selected center frequency includes depositing at least four resonators on a piezoelectric crystal blank having first and second opposed surfaces. Each resonator includes respective electrodes on the first and second surfaces, two of the four resonators being designated input and output resonators. The remaining resonators are designated center resonators. The electrodes of the center resonators on the first sufrace are electrically coupled together. The electrodes on the second surface of the crystal are coupled together to form a common reference. By so doing, fewer electrical mounting pins are required in a holder employed to support the subject multi-resonator crystal. Sufficient impedances are applied between the respective electrodes of the input, output and center resonators to tune out interelectrode capacitance exhibited by such resonators. Deposition of the resonators is continued until each of the resonators resonates at the desired center frequency.

The foregoing describes a multi-resonator monolithic crystal filter and method for fabricating and adjusting the same. The monolithic crystal filter in accordance with the present invention exhibits a reduced number of electrical connecting pins such that crystal packaging restrictions are ameliorated.

While only certain preferred features of the invention have been shown by way of illustration, many modifications and changes will occur to those skilled in the art. It is, therefore, to be understood that the present claims are intended to cover all such modifications and changes as fall within the true spirit of the invention.

I claim:

1. A multi-resonator crystal device comprising:
    a piezoelectric crystal blank having first and second opposed surfaces;
    at least four resonators disposed on said crystal blank, each resonator including a first electrode situated on said first surface and a second electrode situated on said second surface opposite said first electrode, two of said at least four resonators being designated input and output resonators;
    first connecting means situated on said first surface for electrically coupling together the electrodes on said first surface other than the electrodes of said input and output resonators;
    second connecting means situated on said second surface for electrically coupling together said second electrodes, and
    said first and second connecting means being situated sufficiently far apart on said opposed crystal surfaces so as to prevent formation of another resonator by said first and second connecting means.

2. The filter of claim 1 wherein four resonators are disposed on said crystal.

3. The filter of claim 1 wherein at least five resonators are disposed on said crystal.

4. A method for fabricating and tuning a multi-resonator crystal filter having a selected center frequency comprising the steps of:
    depositing at least four resonators on a piezoelectric crystal blank having first and second opposed surfaces, each resonator including respective electrodes on said first and second surfaces, two of said at least four resonators being designated input and output resonators, the remaining resonators being designated center resonators;
    electrically coupling together the electrodes of said center resonators on said first surface;
    electrically coupling together the electrodes on the second surface of said crystal to form a common reference;
    applying sufficient impedances between the respective electrodes of the input, output and center resonators to tune out interelectrode capacitance exhibited by the input, output and center resonators, and
    continuing deposition of the resonators until each of the resonators resonates at said center frequency.

5. The method of claim 4 wherein said continuing deposition step comprises removing electrode material from the resonators until each of the resonators resonates at said center frequency.

* * * * *